United States Patent
Micheloni et al.

(12)

(10) Patent No.: US 6,237,104 B1
(45) Date of Patent: May 22, 2001

(54) METHOD AND A RELATED CIRCUIT FOR ADJUSTING THE DURATION OF A SYNCHRONIZATION SIGNAL ATD FOR TIMING THE ACCESS TO A NON-VOLATILE MEMORY

(75) Inventors: Rino Micheloni, Turate; Giovanni Campardo, Bergamo; Stefano Commodaro, Bogliasco; Guido Lomazzi, Castronno, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/222,070

(22) Filed: Dec. 29, 1998

(30) Foreign Application Priority Data

Dec. 29, 1997 (IT) .............................. MI97A2883

(51) Int. Cl.[7] ...................................... G06F 12/00
(52) U.S. Cl. ............................................. 713/400
(58) Field of Search ............................ 713/400; 711/167, 711/201; 365/189.01, 189.09, 230.01, 233

(56) References Cited

U.S. PATENT DOCUMENTS 3,647,975 * 3/1972 Goto et al. ............................ 370/475
5,365,481 * 11/1994 Sawada ................................. 365/201

* cited by examiner

*Primary Examiner*—Thomas M. Heckler
(74) *Attorney, Agent, or Firm*—Theodore E. Galanthay; E. Russell Tarleton; Seed IP Law Group PLLC

(57) ABSTRACT

A method and related circuit for adjusting the duration of a pulse synchronization signal for the reading phase of memory cells in electronic memory devices which are integrated on semiconductors are discussed. The pulse synchronization signal is produced by a pulse generator when it detects a logical state commutation on at least one input terminal of a plurality of addressing input terminals of the memory cells. The method produces a logical sum between the signal produced by the generator and a pulse signal having a predetermined duration. The logical sum is used to start up the reading phase.

18 Claims, 5 Drawing Sheets

METHOD AND A RELATED CIRCUIT FOR ADJUSTING THE DURATION OF A SYNCHRONIZATION SIGNAL ATD FOR TIMING THE ACCESS TO A NON-VOLATILE MEMORY

TECHNICAL FIELD

This invention relates to a method and to a related circuit for adjusting the duration of pulse synchronization signal ATD for the purpose of timing the reading phase of non-volatile memory cells in electronic memory devices integrated onto semiconductor.

More in particular, the invention relates to a method for adjusting the duration of the pulse synchronization signal for the reading phase of memory cells in electronic memory devices integrated onto semiconductors of the type where said pulse signal is produced by an pulse generator while detecting the logic state commutation of at least one input terminal out of a plurality of addressing input terminals of said memory cells.

BACKGROUND OF THE INVENTION

As it is well known, the reading modalities of the cells of an electronic memory circuit integrated onto semiconductor are possible due to a predetermined sequence of operations known in the technical field as "reading cycle". A reading cycle starts when the memory address of data, which needs to be read, is presented at the input terminals for the memory circuit. An input stage detects the commutation of an address present on such terminals, thus starting a reading operation. Line and column decoding circuits select the memory word which has been addressed.

The circuit portion for reading the memory cell content and for carrying out the conversion of the read analog data into a digital one is called a sense amplifier or reading amplifier. Normally such an amplifier is of a differential type and is provided with a pair of inputs which are respectively connected to a cell of the memory matrix and to a reference cell. Reading becomes possible because of an unbalance of the matrix branch opposite to the reference branch. The data received by the sense amplifier then appears at the output through a buffer output stage.

Each of the previously described phases of the reading cycle must have a predetermined duration which should be compatible with the access time to the memory foreseen by the specifications of the memory circuit. All phases of the reading cycle are timed by synchronization pulses derived from a unique main pulse named ATD (Address Transition Detection). The ATD pulse is generated within the memory circuit each time an address commutation is detected on the input terminals. The ATD pulse generation is generally the task of a NOR structure, which usually has a high logical level output. When a logical level commutation occurs even at only one of the input terminals, the NOR structure commutates its own output allowing the discharging to ground of a terminal wherefrom the ATD pulse is taken via a logic inverter. According to what is at the moment foreseen by the prior art, in the herein attached FIG. 1 there is shown a schematic view of the circuitry dedicated to generating of the ATD signal.

FIG. 1 shows a circuitry 11, or ATD cell, which comprises two N-channel MOS input transistors, indicated by the symbols M1 and M2, respectively, which are very conductive due to their sizing been carried out according to a high W/L ratio. Cell 11 comprises a pair of inverters I1, I2, each one thereof including a complementary CMOS pair with a pull-up transistor and a pull-down transistor. The pull-up transistors of the inverters I1 and I2 are resistive, and therefore little conductive, having been sized according to a low W/L ratio.

The resulting structure of the coupling of the two inverters I1 and I2 corresponds to that of a latch register 3 having outputs Q and Q#. Such latch register 3 is connected to a first capacitor C1 and to a second capacitor C2, as well as to corresponding first and second NMOS transistors M1 and M2, respectively, creating a bistable circuit, which receives as input a signal AX and the corresponding NOT signal AX_N from one of said input terminals. As a result we have a fully symmetric structure, with outputs Q and Q# linked to the values of the input signals AX and A_N. At an idle stage only one of the input signals will have a logical high value, for example equal to A_N. The capacitor C2 will be discharged and will be maintained at mass, whereas it will be possible to charge the capacitor C1 by the pull-up of the first inverter I1. In these conditions, the output Q is at a high logical level, the output Q# accordingly being at a low logical level.

When an input transition occurs, the capacitor C1 will be quickly discharged by the transistor M1, whereas the capacitor C2 will start to recharge thanks to the pull-up of the second inverter I2. Accordingly, the first output Q of the latch 3 will immediately be brought to a low logical level. It will take some more time for the other output Q# to commutate its state, as the pull-up transistors of the inverters I1, I2 are very resistive. There will be a moment when both said outputs will be at a low logical level.

As such outputs Q and Q# are directly connected to the respective inputs of a NOR type logical gate I3, the output of such gate I3 will be forced to a high logical value, thus allowing the switching on of an NMOS transistor connected to the output node 4 of the logical gate I3, as well as to the output node of the circuit 11, referenced by W in FIG. 1.

At each address input terminal of the memory circuit there is associated a cell 11, as schematically shown in FIG. 2. A cell 11 may be associated also to different input terminals, for example to control signals adapted for triggering an ATD signal.

This solution, in the technical field known as distributed NOR, foresees that each cell has its output connected to a single ATD-LINE line 7, which is usually given by a metalization line connected to the VDD power supply by means of a PMOS transistor M4 having a control terminal GND connected to ground.

The nodes W of the output transistors of the circuit 11, as shown in FIG. 1, are connected to each other to comprise the ATD-LINE line 7 of FIG. 2.

From this line 7 the ATD pulse is taken by means of an inverter 5. The ATD is generated by a transition of at least one of the input terminals, and it represents the signal that triggers the reading.

In ideal operating conditions, the addresses are shown at the same time at the memory device pins, or are modified within a time interval not smaller than the access time, as shown for instance in the diagrams of FIG. 3. Unfortunately, no specification guarantees that the user will work adopting these precautions.

The user obviously has the right to continuously and arbitrarily change the addresses of the memory locations which he likes to access; the valid address is the last one, that is the one for which the memory device must for sure show the data at the output. Anyway, as it is impossible to know in advance which is the last address on the basis of the present specifications, the device must always be ready on any transition of the addresses because any of them could be the last. In the case of a fully static memory, that is a memory which is not provided with precharged nodes, no major problem occurs as the signal flow, from the addresses to the outputs, behaves like a flow of signals within combinatory logic.

In presence of precharged nodes, on the contrary, it is necessary to observe compelling timings for the recharge of the nodes, otherwise reading errors may be encountered.

Let's consider, for example, the case wherein commutations occur the one after the other spaced by a time greater than the ATD pulse duration. In this situation, schematically shown by the solid line 12 of FIG. 4, various distinct ATD pulses would occur in sequence. On the other end should the commutations be closer, as highlighted by the solid line 13 of FIG. 4, then the single pulses would be such as to keep the line 7 to ground and the ATD output signal would remain high till the last commutation.

Therefore it is essential to trigger the reading phase on the declining ramp of the ATD pulse, otherwise it may happen that reading phases are triggered on non valid addresses.

To fully understand all the aspects of this invention, it is important to consider a further constraint.

At the moment, the operating range typical of a non volatile memory is characterized by a temperature of between −40° C. and 130° C. and by a feed voltage between 2.5 and 3.8 V. For example, the variation of these two parameters brings a variation in the ATD pulse duration. This latter may have a maximum duration of about 10 ns at 3.8 V and −40° C. and a minimum duration of about 2 ns at 2.5 V and 130° C.

The sizing of the ATD pulse should therefore fulfill two requirements:

it should be long enough not to be filtered during its propagation by the parasitic capacitances which are given in the circuitry for the reading path;

it should be short enough to quickly show the declining ramp after the address commutation; in fact the true reading phase only starts on the declining ramp of the ATD and therefore the ATD duration fully influences the access time.

Prior art proposes to carry out a temperature and voltage compensation with the purpose to obtain a pulse of reasonable duration in all the operating conditions.

This possible solution, however, is not able to solve the problem, when the number of ATD cells is quite high. For example, in the modern memory devices there are at least twenty ATD cells and their number is likely to increase along with the density increase of the devices because in this way the number of address bits increases.

To compensate all these cells means a problem of occupied circuit area, of accuracy and of circuit complexity.

SUMMARY OF THE INVENTION

An embodiment of this invention is directed to a method and a related circuit for adjusting the duration of a pulse ATD signal, which method and circuit have respective operating and structure features such as to permit an ATD signal to be long enough to be detected and short enough not to influence in excess the access time.

The method includes logically combining the ATD pulse with a pulse of predetermined and compensated duration, thus obtaining a single ATD signal to be used in all the memory circuitry.

The features and the advantages of the method and circuit according to this invention, will become clear from the following specification of an embodiment thereof, which is herein set as example for descriptive and non limiting purposes, with reference to the attached drawings.

DETAILED DESCRIPTION

Figure 1:
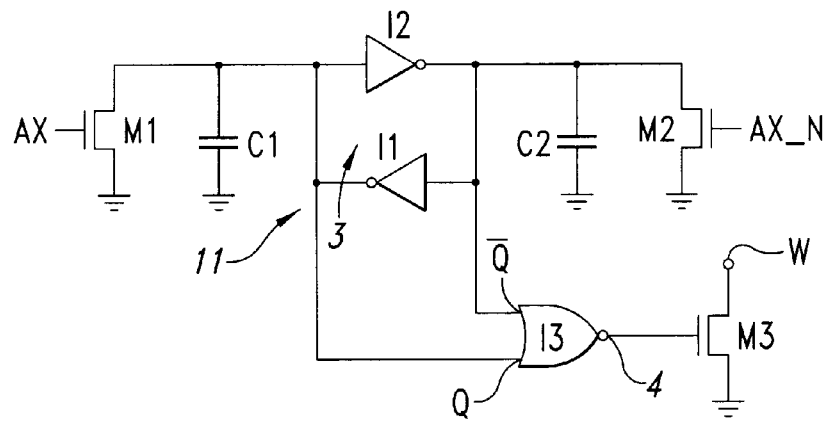
FIG. 1 shows a schematic view of a circuit realized according to the prior art for generating an pulse ATD signal.
Figure 2:
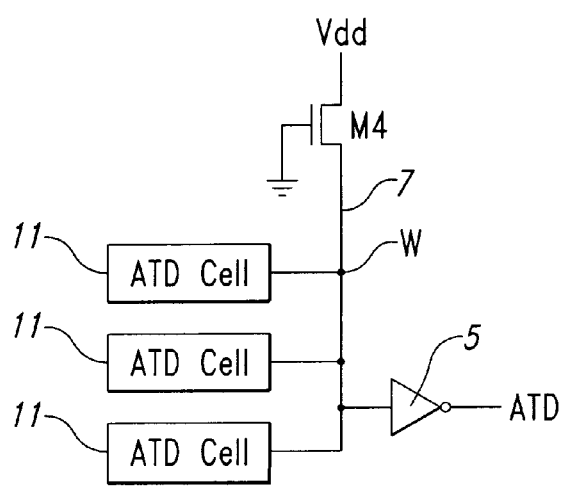
FIG. 2 shows a schematic view of the circuit assembly according to FIG. 1 connected to form a distributed NOR structure for generating an pulse ATD signal.
Figure 3:
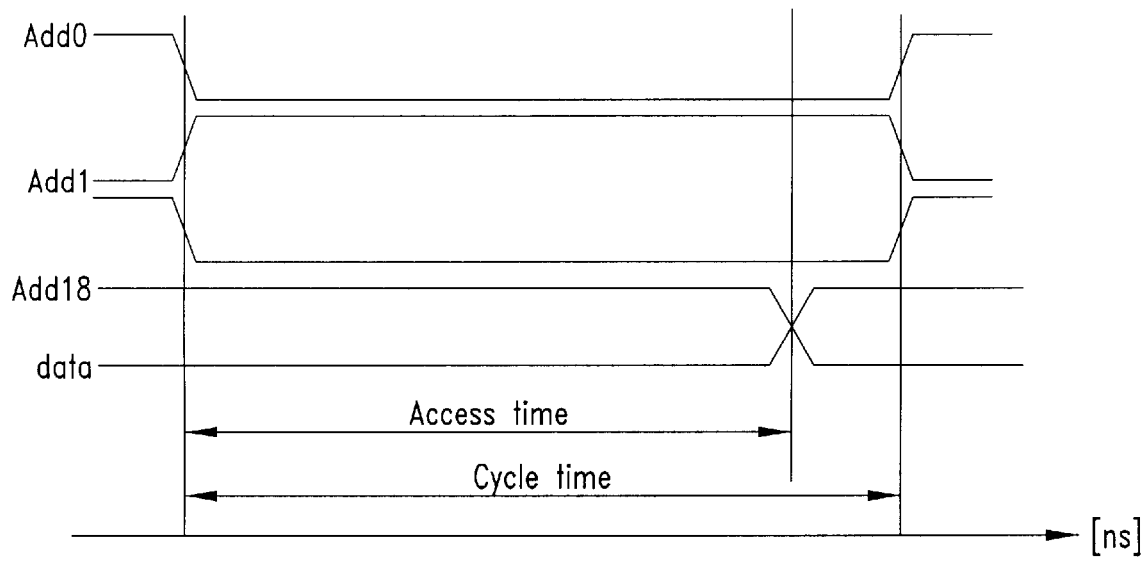
FIG. 3 shows a diagram of the set of the address transition signals having the same time basis.
Figure 4:
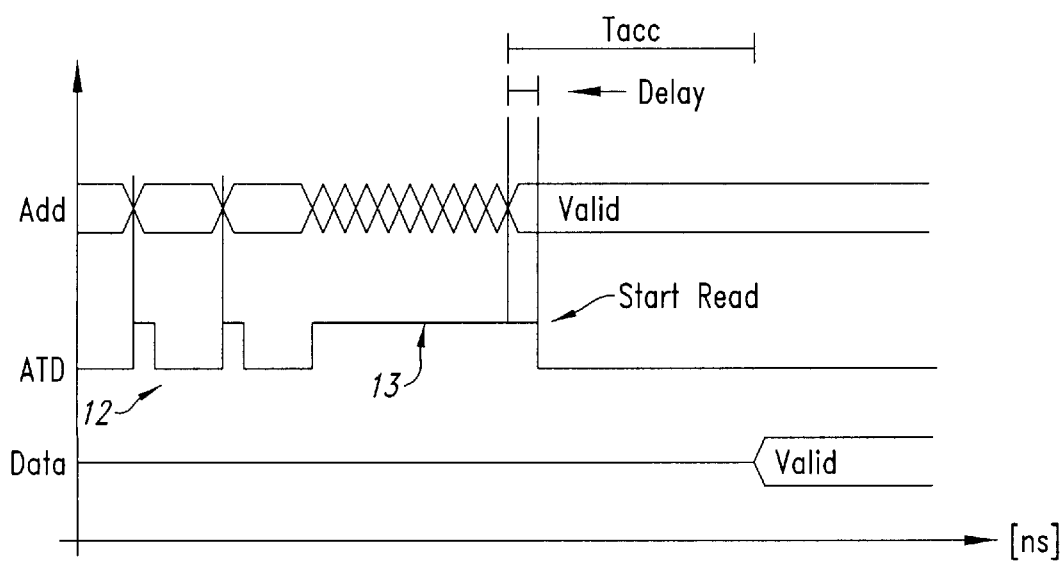
FIG. 4 shows a comparative diagram between a set of address transition signals and the corresponding set of ATD pulses.
Figure 5:
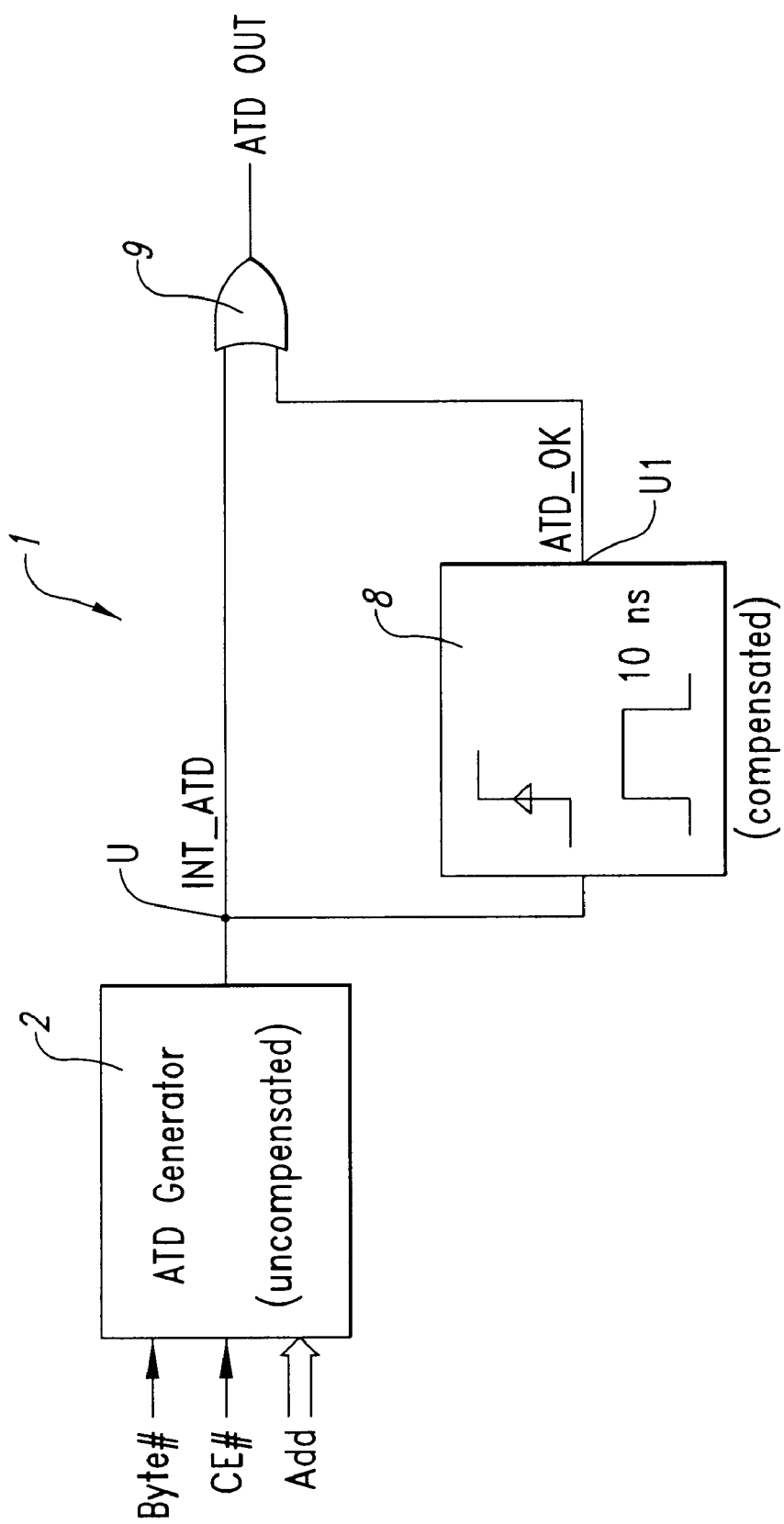
FIG. 5 shows a schematic view of a circuit realized according to an embodiment of this invention.

With reference to the drawings, and in particular to the example of FIG. 5, there is wholly and schematically indicated a circuit, realized according to an embodiment of the invention for generating an ATD (Address Transition Detection) signal to be used during a reading cycle of memory cells.

By memory cell it is meant a plurality of memory elements incorporated in a conventional electronic device integrated on semiconductor and having a structure characterized by a matrix of cells organized in rows and columns. To the matrix there are associated corresponding circuit portions for decoding rows and columns, as well as reading amplifiers.

Such circuit components are fed between a first feed voltage reference Vcc and a second voltage reference GND.

The memory cells may be of any kind; in particular the non-volatile type of memory is preferred.

The circuit 1 comprises a conventional ATD signal generator 2. The generator 2 depends upon input signals: Byte#, CE# and ADD which permit detection of a transaction of the address terminals and are adapted for triggering the ATD signal. The generator 2 has an output U on which there is produced an INT_ATD signal without any temperature and/or voltage compensation. This permits to use a very compact generator 2.

The circuit 1 comprises a circuit portion 8 which receives as input the output U of the generator 2. Such portion 8 is dedicated to generating a pulse signal ATD_OK stable as far as temperature and voltage are concerned. To this purpose portion 8 is temperature and voltage compensated.

Figure 7:
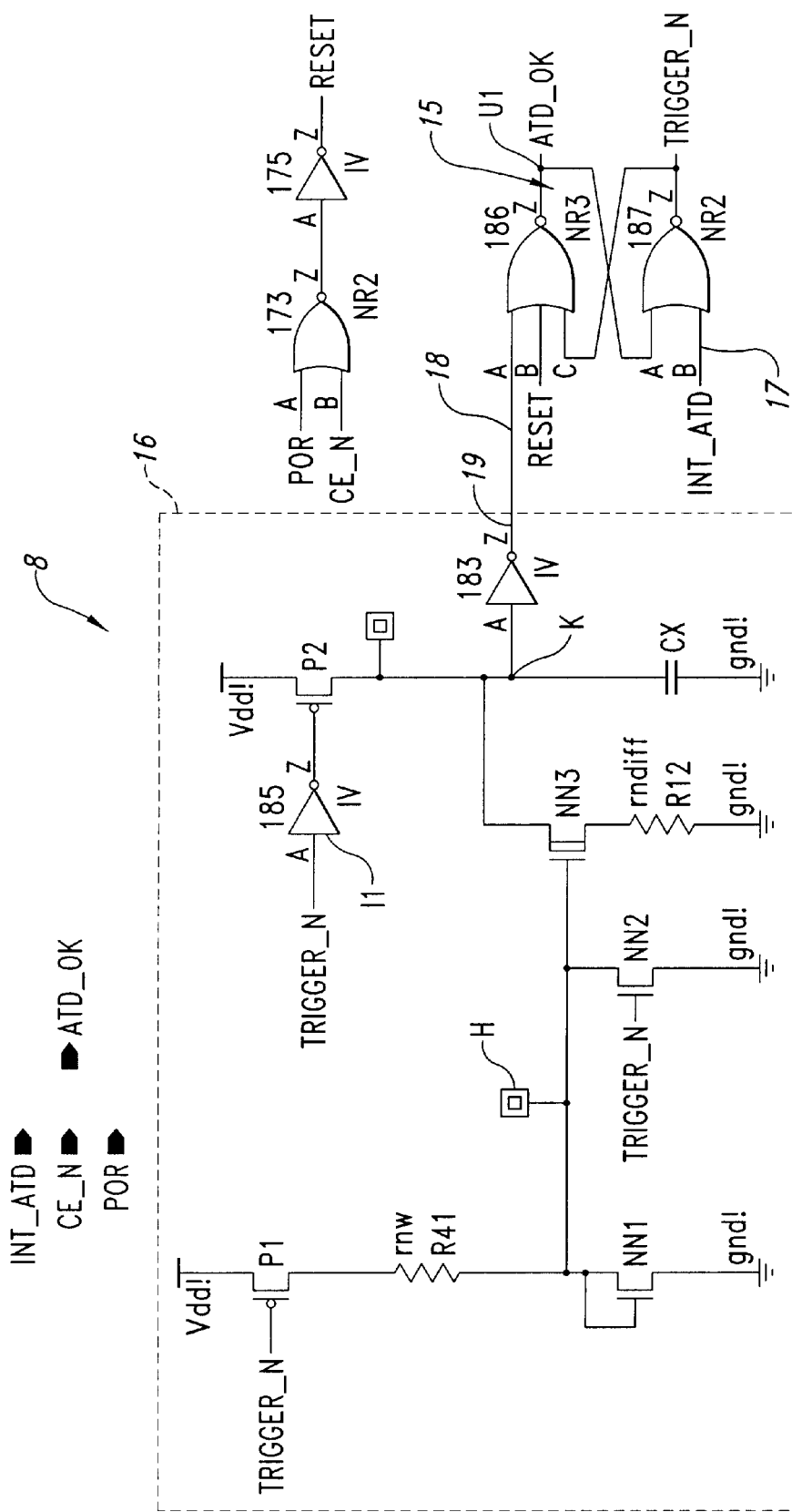
FIG. 7 shows a schematic view of a detail of the circuit of FIG. 5.

For example the circuit portion 8 can be realized by means of a compensated pulse generator shown for instance in FIG. 7. The example of FIG. 7 is related to a circuit 8 fed between a feed voltage reference Vdd and the ground GND. The circuit 8 receives as input the signal TRIGGER_N directly applied to the control terminal of a PMOS transistor P1 which is connected in series with a resistance R41 and to a NMOS transistor NN1 in diode configuration.

The interconnection node H between the resistance R41 and the transistor NN1 is connected to the gate terminal of a natural transistor NN3 with low threshold and N channel. The node H is connected to ground by means of a NMOS transistor NN2 which receives the signal TRIGGER_N. The PMOS transistor P1 and the NMOS transistor NN2 essentially implement an inverter having an output coupled to the gate terminal of the natural transistor NN3. The source terminal of such natural transistor NN3 is connected to ground by means of a resistance R12, whereas the drain terminal is connected to an intermediate node K. The node K is connected towards the feed supply by means of a second PMOS transistor P2 which receives on the gate terminal the signal TRIGGER_N via an inverter I1. Further on, the node K is connected to ground by means of a capacitor CX.

The node K is also connected towards the output U1 of the circuit 8 via an inverter I2 and a logic network 15 which comprises and a pair of cross-linked logical gates NR3 and NR2 with a feedback link to the PMOS transistor P1. Advantageously, the signal ATD_OK is generated starting from the up ramp of the signal INT_ATD. Such signal ATD_OK is determined on the basis of the slower specification time for the uncompensated generator 2. In a practical embodiment thereof, such signal ATD_OK may be equal to 10 ns. The circuit portion 8 has an output U1 at which the signal ATD_OK is produced, which is connected to one of the inputs of a OR type logical gate 9 (FIG. 5). The OR gate 9 is of the two inputs type and directly receives on the other input the output signal INT_ATD from the generator 2. The dependence condition of the signal ATD_OK (first input signal of the OR gate) on the slower specification time of the output signal of the uncompensated generator 2 (second input signal of the OR gate) is therefore found again.

Obviously the logical gate 9 can be of another type, though it should have anyway at least two inputs and be able to produce as output the OR function of the input signals. The logical gate 9 has an output OUT on which the logical sum of the pulse signals given at the intermediate outputs U and U1 of the circuit 1 is effected. In other words, the definitive ATD signal to be used in all the reading path is given by the OR operation between the signals INT_ATD and ATD_OK.

The circuit portion 8 essentially is implemented by a latch (logic network 15) with a feedback loop comprising a delay stage 16. The latch 15 has a first input 17 coupled to the output U of the uncompensated ATD generator 2, a second input 18 coupled to an output 19 of the delay stage 16, a first output U1 at which the ATD_OK signal is produced, and a second output 20 at which the signal TRIGGER_N is produced. As discussed above, the signal TRIGGER_N is provided to the PMOS transistor P1, and NMOS transistor NN2, and the inverter I1 of the delay stage 16. In response to being triggered by the up ramp of the INT_ATD signal from the uncompensated ATD generator 2, the latch 15 produces an up ramp in the ATD_OK signal. The latch 15 keeps the ATD_OK signal at a high level until the preset delay of the delay stage 16 causes the signal at the output 19 of the delay stage to go high, which causes the NOR gate NR3 of the latch 15 to drive the ATD_OK signal low.

The great advantage of this solution is given by the fact that it is not necessary to worry about which minimum duration the internal pulse INT_ATD has, because this is no longer transferred directly to the reading path as is the case in the prior art. On the contrary, it is the pulse ATD_OK, of predetermined duration, which defines the minimum duration of the ATD final pulse. The circuit 1 has a size such that the intermediate pulse INT_ATD is detachable from the compensated pulse generator 8 in the fastest operating conditions of the memory device, for example at 3.8 V and −40° C. In these conditions, the INT_ATD duration is for example equal to about 2 ns. The duration of the signal ATD_OK is chosen to be equal to the duration of the pulse INT_ATD in the slowest operating conditions at 2.5 V and 130° C. which induced the compensated pulse generator 8 to generate a pulse ATD_OK with a duration of, for instance, about 10 ns.

Figure 6A:
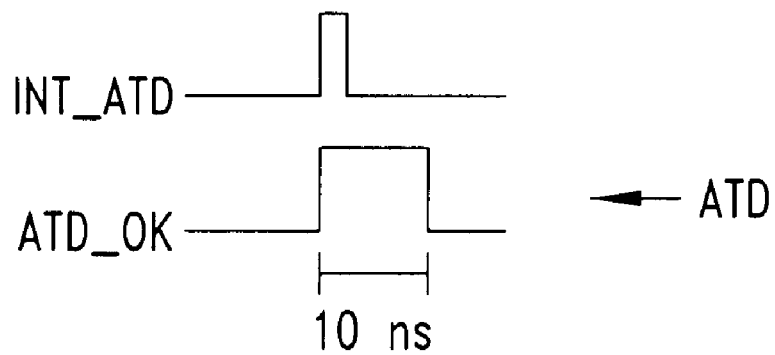
FIGS. 6a and 6b shows respective schematic examples of two different operating conditions of the circuit of FIG. 5.
Figure 6B:
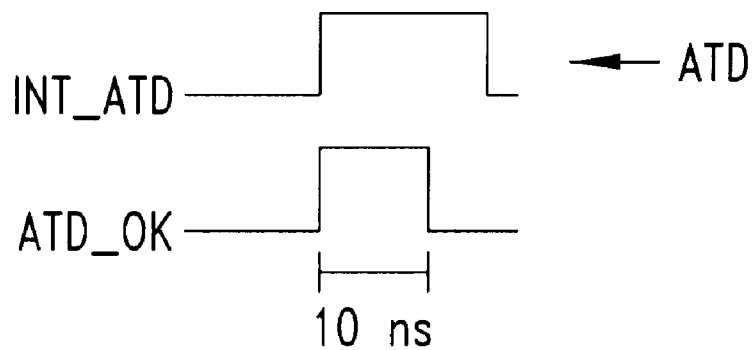

Now we can have a look at the method for adjusting the ATD signal according to the present invention, with the aid of the FIGS. 6a and 6b. The generator 2 of the circuit 1 generates a first intermediate signal INT_ATD at each transition on the address inputs.

FIG. 6a shows a first case wherein the signal INT_ATD is shorter than the signal ATD_OK generated by the pulse generator 8. This situation can happen for example when temperature and voltage are such as to produce an uncompensated pulse which is very fast. Without the features proposed by the present invention there is a risk of losing such signal in its propagation through the reading path. The logical combination in the gate 9 of the signal INT_ATD with the signal ATD_OK which is of sufficient duration, allows for the final ATD signal to correctly propagate.

On the contrary in FIG. 6b there is shown a case wherein the signal INT_ATD is longer than ATD_OK. This situation can occur when there are various address commutations occurring before the valid one.

In this instance the signal INT_ATD includes the signal ATD_OK and the reading can correctly start only after the last commutation, which is the valid one. The problem of the sufficient length of the pulse does not arise because the final ATD signal will be greater than the one compensated named ATD_OK which is anyway of sufficient duration for the hypothesis set. The method and the circuit provide a number of advantages such as the adaptability of the duration of the ATD pulse to the actual access requirements to the memory.

The generating net of the signal INT_ATD can be sized in such a way that in the fastest operating conditions such signal be as small as desired. In doing this, even in the opposite slower situation, the delay introduced in the access time is minimal.

Furthermore, the OR operation on the pulses INT_ATD and ATD_OK guarantees for the absence of spurious pulses or glitches in the final ATD signal. This prevents false start ups of the reading operation. As a conclusion, the method and system provide an ATD signal of minimum duration if compared with the operation conditions in which the memory device is going to operate. Furthermore, the delay on the access time during the reading phase is also minimized.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for adjusting the duration of a pulse synchronization signal for the reading phase of memory cells in electronic memory devices which are integrated on semiconductors, the method comprising producing said pulse synchronization signal by a pulse generator when it detects a logical state commutation on at least one input terminal of a plurality of input terminals for addressing said memory cells, and generating a logical sum comprising the pulse synchronization signal produced by the generator and a pulse signal having a predetermined duration, said logical sum being the pulse synchronization signal adjusted by the pulse signal to be used to start up the reading phase.

2. The method according to claim 1, wherein said pulse signal is generated starting from an up ramp of the pulse synchronization signal produced by the generator.

3. The method according to claim 1, wherein said pulse signal is stable with temperature and voltage.

4. The method according to claim 1, wherein said pulse signal has a duration limited by a specified maximum time typical of the generator.

5. A circuit for adjusting the duration of a pulse synchronization signal for timing the reading phase of memory cells in electronic memory devices that are integrated on semiconductors, the circuit comprising:

a first pulse generator dependent upon a logical state commutation on at least a input terminal of a plurality of addressing input terminals of said memory cells;

a second pulse generator; and a logical gate that receives as input at least outputs of the first and second pulse generators and adjusts the duration of the pulse synchronization signal to be the duration of the output or the second pulse generator.

6. The circuit for adjusting the duration of a pulse synchronization signal according to claim 5, wherein said logical gate is of the OR type with two inputs.

7. The circuit for adjusting the duration of a pulse synchronization signal according to claim 5, wherein said second pulse generator is a compensated pulse generator.

8. The circuit for adjusting the duration of a pulse synchronization signal according to claim 5, wherein said second pulse generator generates a pulse starting from an up ramp of a signal produced by said first pulse generator.

9. The circuit for adjusting the duration of a pulse synchronization signal according to claim 8, wherein the pulse produced by said second pulse generator has a duration limited by a specified maximum time typical of the first pulse generator.

10. A pulse synchronization circuit for producing a pulse synchronization signal of fixed duration for controlling a read phase of a memory circuit, the controlled circuit comprising:

a first pulse generator structured to produce at an output a first pulse of variable duration in response to detecting a logical state commutation on an address input terminal of the memory circuit; and a second pulse generator having an input coupled to the output of the first pulse generator and an output, the second pulse generator being structured to produce at its output a second pulse of fixed duration in response to receiving the first pulse from the first pulse generator.

11. The pulse synchronization circuit of claim 10, further comprising an output stage having an input coupled to the output of the second pulse generator, the output stage being structured to output the pulse synchronization signal with its duration depending on the second pulse.

12. The pulse synchronization circuit of claim 11 wherein the output stage includes an OR gate having a first input coupled to the first pulse generator, a second input coupled to the second pulse generator, and an output the pulse synchronization signal is produced as the logical sum of the first and second pulses.

13. The pulse synchronization circuit of claim 10 wherein the second pulse generator includes:

a latch having first and second inputs and first and second outputs, the first input being coupled to the output of the first pulse generator and the first output being the output of the second pulse generator; and a delay stage having an input coupled to the second output of the latch and an output coupled to the second input of the latch.

14. The pulse synchronization circuit of claim 13 wherein the latch includes a pair of cross-coupled NOR gates having respective first and second inputs and an output; a first NOR gate of the pair having its first input coupled to the output of the first pulse generator, its second input coupled to the output of a second NOR gate of the pair, and its output coupled to the first input of the second NOR gate; the second input of the second NOR gate being coupled to the output of the delay stage.

15. The pulse synchronization circuit of claim 13 wherein the delay stage includes:

a first inverter having an input coupled to the second output of the latch and an output;

a first transistor having a control terminal coupled to the output of the first inverter, a first terminal coupled to a first voltage reference, and a second terminal;

a second transistor having a control terminal coupled to the second output of the latch, a first terminal coupled to a second voltage reference, and a second terminal coupled to the second terminal of the first transistor, wherein the second terminals of the transistors are coupled to the output of the delay stage.

16. A method of controlling a read phase of a memory circuit, the method comprising:

producing a first pulse of variable duration in response to detecting a logical state commutation on an address input terminal of the memory circuit;

producing a second pulse of fixed duration in response to receiving the first pulse;

outputting a pulse synchronization signal having a duration based on the duration of the second pulse; and using the pulse synchronization signal to control timing of the read phase.

17. The method of claim 16 wherein the outputting act includes logically summing the first and second pulses to give the pulse synchronization signal a duration equal to whichever of the first and second pulses has a longer duration.

18. The method of claim 16 wherein the act of producing the second pulse includes:

triggering a change in an intermediate signal from a first logical level to a second logical level based on a similar change in the first pulse;

latching the intermediate signal at the second logical level for a predetermined delay period; and changing the intermediate signal from the second logical level back to the first logical level upon ending the predetermined delay period.

* * * * *